(12) United States Patent
Bedeschi et al.

(10) Patent No.: US 8,760,938 B2
(45) Date of Patent: Jun. 24, 2014

(54) WRITING BIT ALTERABLE MEMORIES

(75) Inventors: Ferdinando Bedeschi, Biassono (IT); Claudio Resta, Pavia (IT); Richard Fackenthal, Carmichael, CA (US); Ruili Zhang, Rancho Cordova, CA (US)

(73) Assignee: Intel Corporation, Santa Clara, CA (US)

( * ) Notice: Subject to any disclaimer, the term of this patent is extended or adjusted under 35 U.S.C. 154(b) by 1498 days.

(21) Appl. No.: 11/906,722

(22) Filed: Oct. 3, 2007

(65) Prior Publication Data
US 2009/0091988 A1 Apr. 9, 2009

(51) Int. Cl.
*G11C 7/00* (2006.01)
(52) U.S. Cl.
USPC ....... 365/189.09; 365/148; 365/194; 365/207
(58) Field of Classification Search
USPC .............................. 365/148, 189.09, 194, 207
See application file for complete search history.

(56) References Cited

U.S. PATENT DOCUMENTS

| | | | | |
|---|---|---|---|---|
| 2004/0246808 | A1* | 12/2004 | Cho et al. | 365/230.06 |
| 2005/0162303 | A1* | 7/2005 | Cho et al. | 341/200 |
| 2006/0220071 | A1* | 10/2006 | Kang et al. | 257/248 |
| 2007/0217253 | A1* | 9/2007 | Kim et al. | 365/163 |

* cited by examiner

*Primary Examiner* — Hoai V Ho
(74) *Attorney, Agent, or Firm* — Trop, Pruner & Hu, P.C.

(57) ABSTRACT

A bit alterable memory may include current generators in a periphery outside the main memory core. Current may be generated in the periphery and driven into the core. As a result, the capacitance of the memory cells has a lowered effect. The current may be generated using the chip supply voltage and then mirrored using a pump voltage. In some embodiments, the mirroring may be ratioed at the partition level and multiplied at the plane level. A delay may be provided before applying the currents to the cell to accommodate for transients.

28 Claims, 5 Drawing Sheets

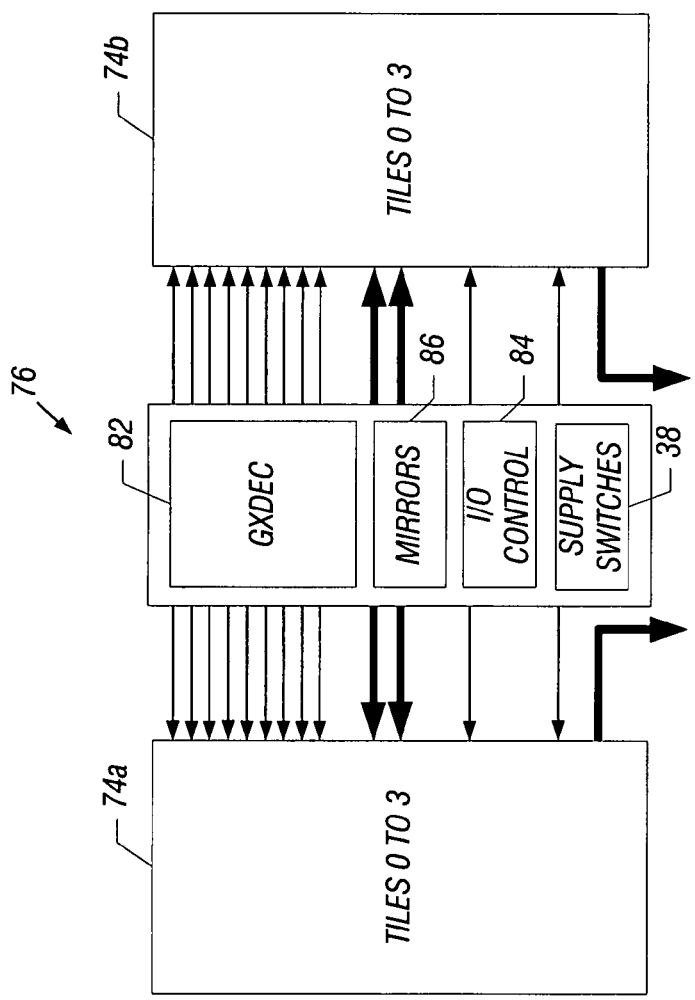
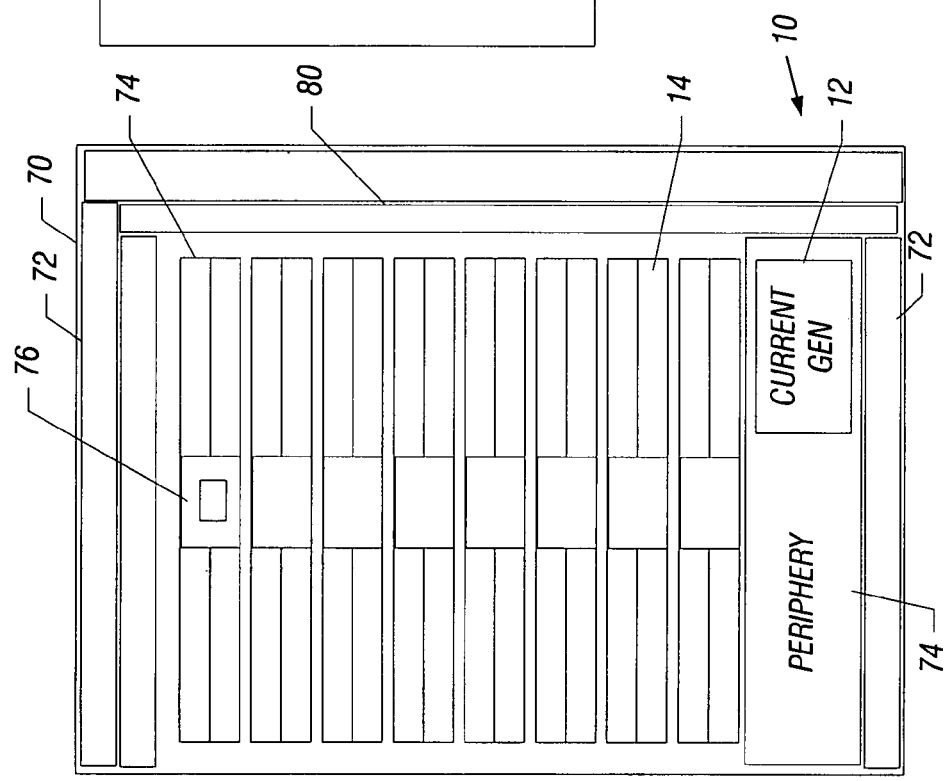

WRITING BIT ALTERABLE MEMORIES

BACKGROUND

This relates generally to bit alterable memories.

A bit alterable memory is a memory that can be altered by writing at the bit level. For example, flash memories generally are written in bulk across a number of cells at the same time. Bit alterable memories, such as lone-pair semiconductor or phase change memories, dynamic random access memories, polymer memories, ferroelectric random access memories, and magnetic random access memories can be written one bit at a time.

Phase change memory devices use phase change materials, i.e., materials that may be electrically switched between a generally amorphous and a generally crystalline state, for electronic memory application. One type of memory element utilizes a phase change material that may be, in one application, electrically switched between a structural state of generally amorphous and generally crystalline local order or between different detectable states of local order across the entire spectrum between completely amorphous and completely crystalline states. The state of the phase change materials is also non-volatile in that, when set in either a crystalline, semi-crystalline, amorphous, or semi-amorphous state representing a resistance value, that value is retained until changed by another programming event, as that value represents a phase or physical state of the material (e.g., crystalline or amorphous). The state is unaffected by removing electrical power.

BRIEF DESCRIPTION OF THE DRAWINGS

FIG. 3 is a chip layout in accordance with one embodiment of the present invention;

FIG. 4 is a circuit schematic in accordance with one embodiment of the present invention;

DETAILED DESCRIPTION

In accordance with some embodiments, write current or current used to write a cell may be generated in the periphery and driven to the core. The core is a portion of an integrated circuit semiconductor memory which includes the actual memory cells. The core is packed with the memory cells and the region around the core, which does not include the memory cells, is called the periphery. Addressing circuits, for example, may conventionally be provided in the periphery.

In connection with many types of bit alterable memories, a relatively large programming current is necessary. This programming current may be developed using pump voltages that are much higher than conventional supply voltages available on integrated circuits, which are generally referred to as $V_{CC}$.

Figure 1:
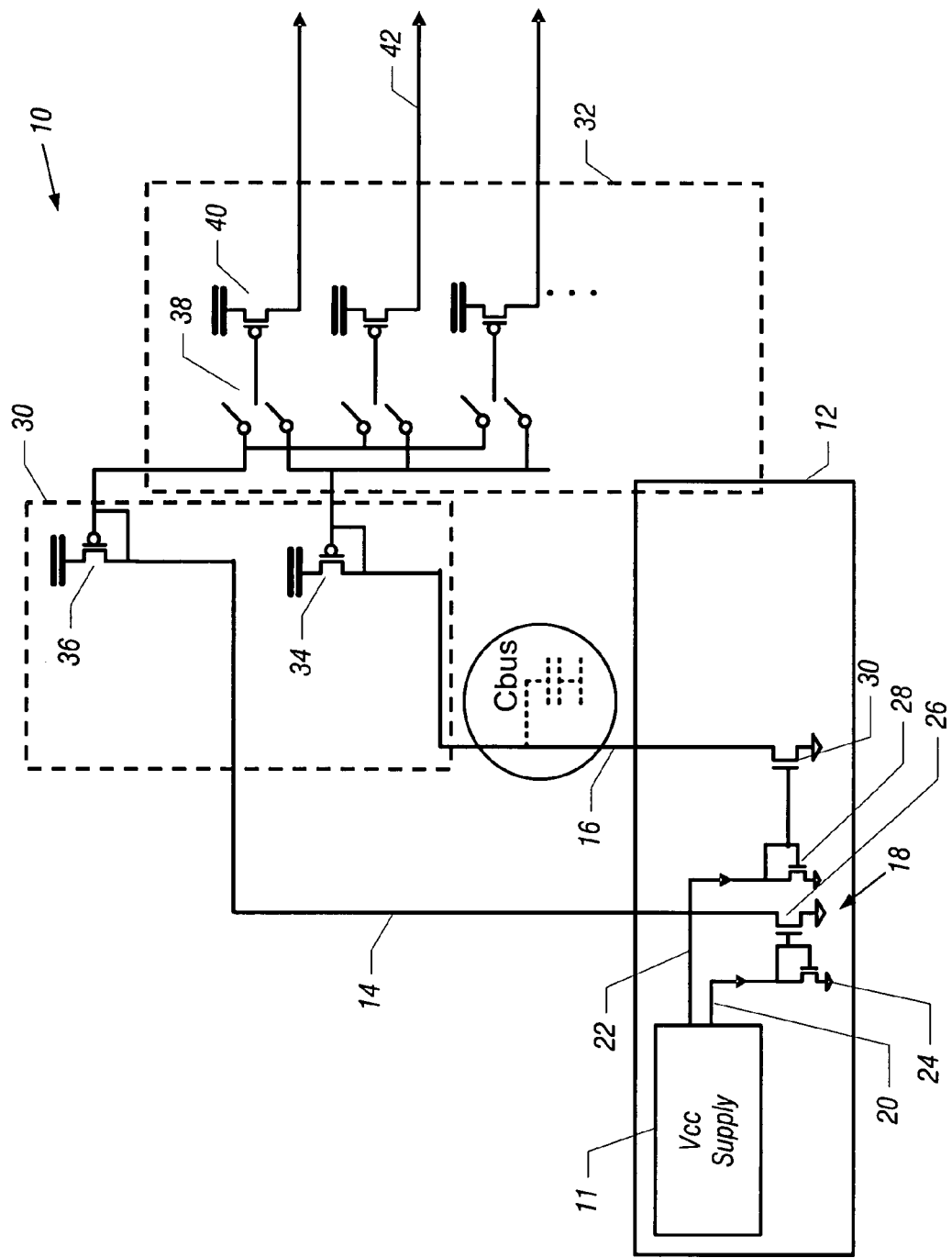
FIG. 1 is a circuit schematic for one embodiment of a write circuit.

Referring to FIG. 1, a current generator 12 may include a plurality of transistors 24, 26, 28, and 30 which collectively form current mirrors and supply two different current levels, in accordance with one embodiment of the present invention. One current level may be sufficient to program a cell to a lower resistance or set state and another current level is sufficient and shaped to supply current to program to a higher resistance of reset state in one embodiment. Particularly, the set current is outputted on the line 14 and the reset current is outputted on the line 16.

The current generator 12 may be based on the supply voltage or $V_{CC}$ level, as opposed to the pump level. The $V_{CC}$ supply supplies two different potentials 20 and 22, the potential 20 is used to develop the set current on the line 14 and the potential 22 being used to develop the reset current on the line 16. The current mirrors 18 mirror the generated currents and pass them on over current lines 14 and 16 to the core.

In the core, the memory may be broken up into grouped cells. For example, a tile may include 1000 cells, arranged in 100 rows and 100 columns. Eight tiles may be combined to form one plane and two planes may be combined to form one partition, in accordance with one embodiment of the present invention.

The current generated by the current generator 12 may be provided at the partition 30 level. In particular, the partition level may include voltage pump transistors 34 and 36 acting as current mirrors to further increase the current level up to the level needed for programming. Note, however, that the voltage in the current lines 14 and 16 is much lower than would be the case with voltage pump lines and, therefore, the bus capacitance, indicated as CBUS, has less of an affect than it would have if the higher voltage levels associated with the pump voltage were exposed to the bus capacitance.

From the partition level, the set and reset current levels are passed down to the plane level 32. In the plane level, eight write circuits may be provided, one for each tile. Each write circuit may include a transistor 40, coupled to the pump voltage. A series of switches 38 provide the write signals to the correct tiles at the correct levels. For example, depending on which tile needs to be programmed, and whether it is being programmed to set or reset levels, the appropriate signal is provided by the switches 38 from the sources composed of the mirrors 34 and 36.

Thus, it can be seen that each of the partitions 30 has its own write mirrors 34 and 36. Current is generated in the periphery and driven to the core.

Referring to FIG. 3, in accordance with some embodiments, a chip layout is illustrated. The chip 10 may include a periphery 74 which includes the current generator 12. The core 14 includes the actual memory cells, in one embodiment, arranged in tiles, planes, and partitions.

Figure 2:
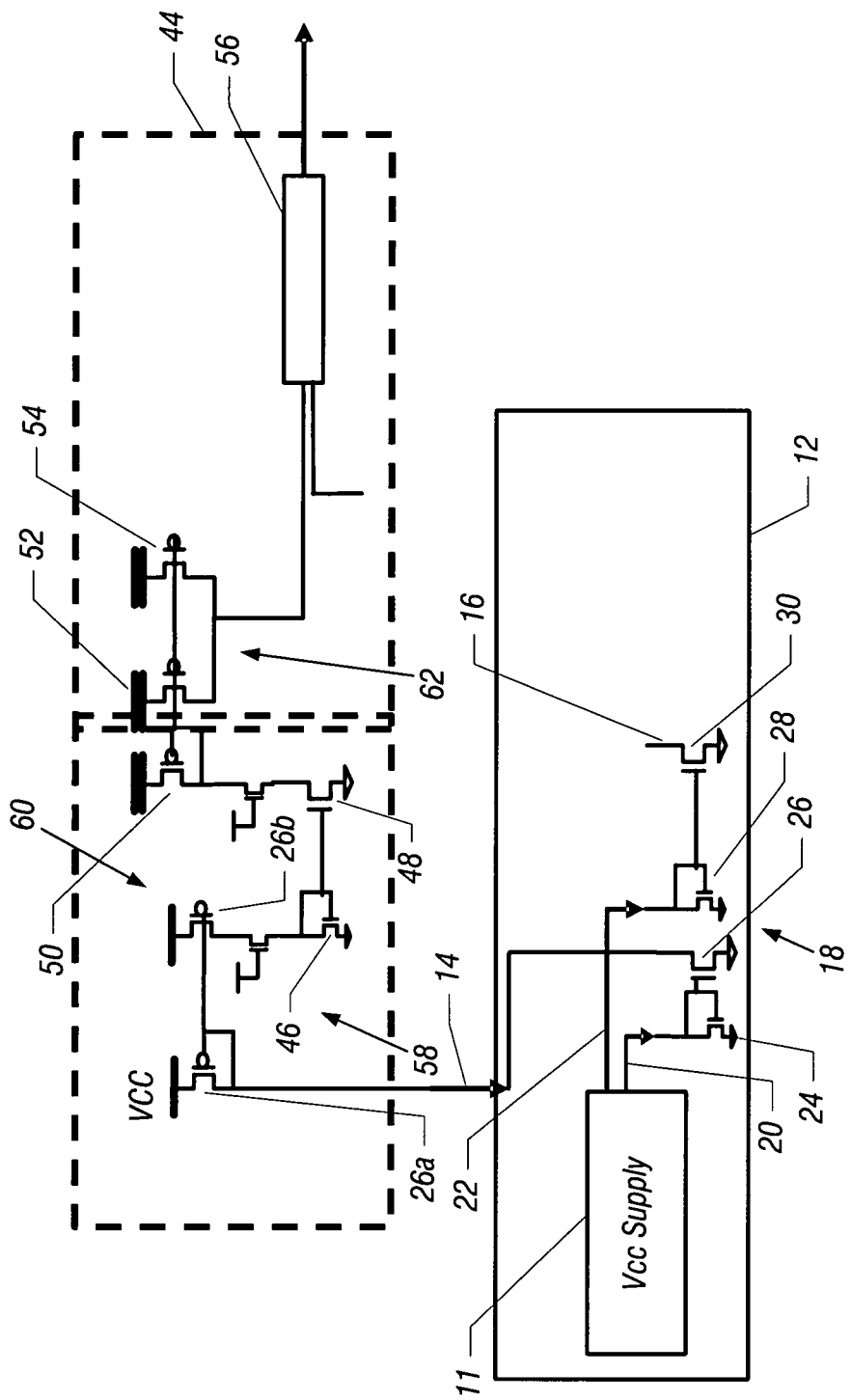
FIG. 2 is a circuit diagram for a second embodiment of a write circuit.

Turning next to FIG. 2, in accordance with another embodiment of the present invention, the periphery 12 may be configured exactly as described above in connection with FIG. 1. However, only the set current source is actually used in this case. The reference current for the set phase is provided on the line 14 to a transistor 26a which is part of a current mirror including the transistor 26b. The reference generators are provided at the partition level again. Each of the transistors 26a and 26b are coupled on their sources to a supply voltage ($V_{CC}$) level, as opposed to a pump level.

The current mirrors 26a and 26b are then coupled to mirrors 50 and 52 which are ratioed 1 to N (in this example, N=3) to the transistors 50 and 52 of plane 44 level. This level is then transferred to the plane write circuits 44. The resulting current may be boosted times N at 62 using the current mirror transistors 52 and 54. The resulting current provided to each tile may be provided through an N-type PMOS transistor 56 in one embodiment.

Again, current is generated in the periphery and driven to the core, each partition has its own write circuit, current is sinked locally in the core from $V_{CC}$ and not from the pump in this embodiment. Current is then locally mirrored and ratioed 1 over N from the pump to generate the local reference.

The output mirror transistors 52, 54 increase current by a factor of N to obtain the desired current level in the selected cell. Since it is not necessary to have both a set and a reset reference, only the set level 14 may be utilized. Then, in one embodiment, the actual current that is developed is compared to the set level. If the current differs from the set level, it can be determined that a selected cell to be read is at a reset level.

In some embodiments, current multiplexing may be obtained using gate switching of the transistors 40 (FIG. 1). This may avoid additional drops, reducing voltage head room.

All of the circuitry shown at 76, in FIG. 4, is provided within the core 14 in FIG. 3. Referring to FIG. 4, in accordance with one embodiment, the circuitry 76 includes the tiles 0 to 3, 74*a*, and the tiles 4 to 7, 74*b*. A global decoder 82 is coupled to the tiles. Extending from the global decoder 82 is a plurality of global word lines. The mirrors 86, already described, provide the set and reset bus signals as indicated. An input/output control 84 is also coupled to the tile. The supply switches 38 are, likewise, coupled to the tile.

Figure 5:
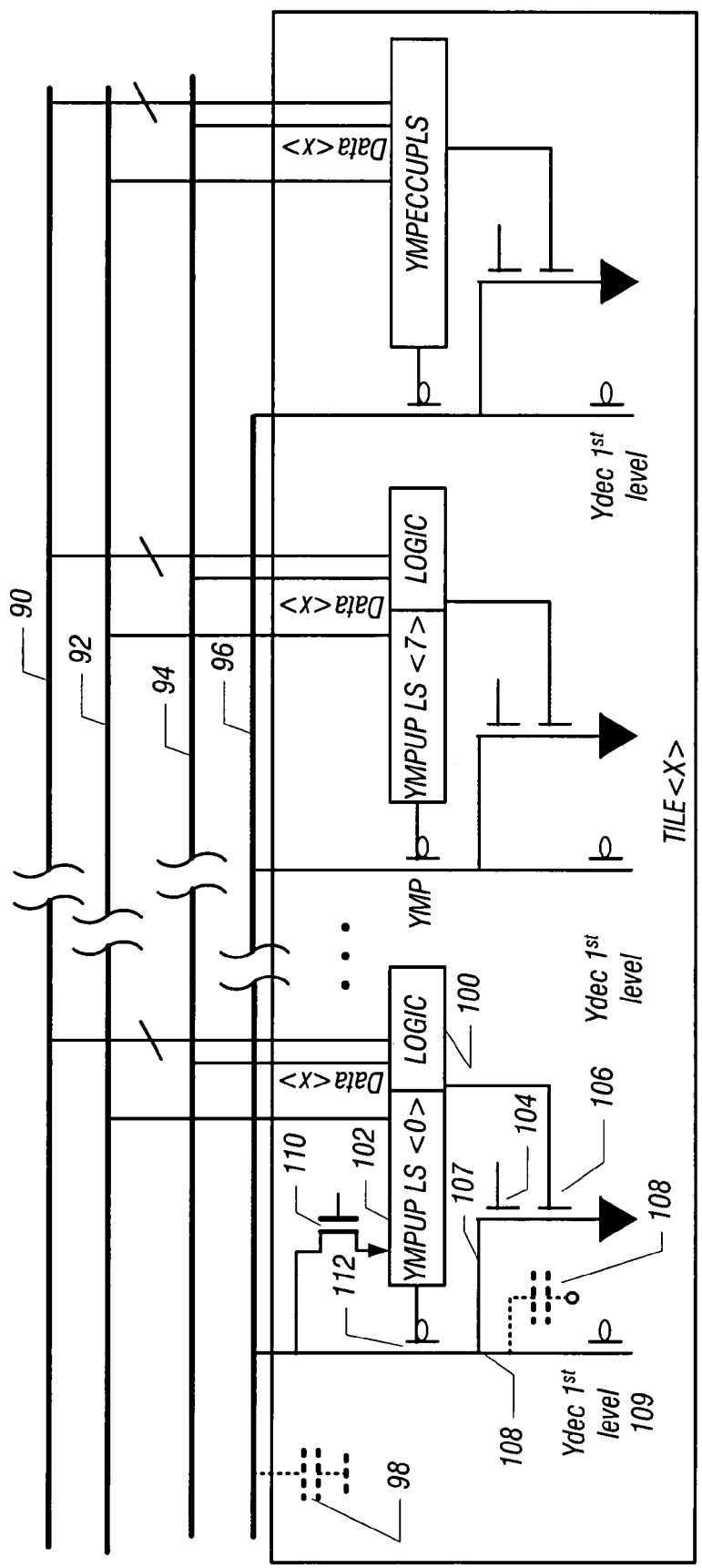
FIG. 5 is a schematic of a chunk of memory in accordance with one embodiment of the present invention.
Figure 6:
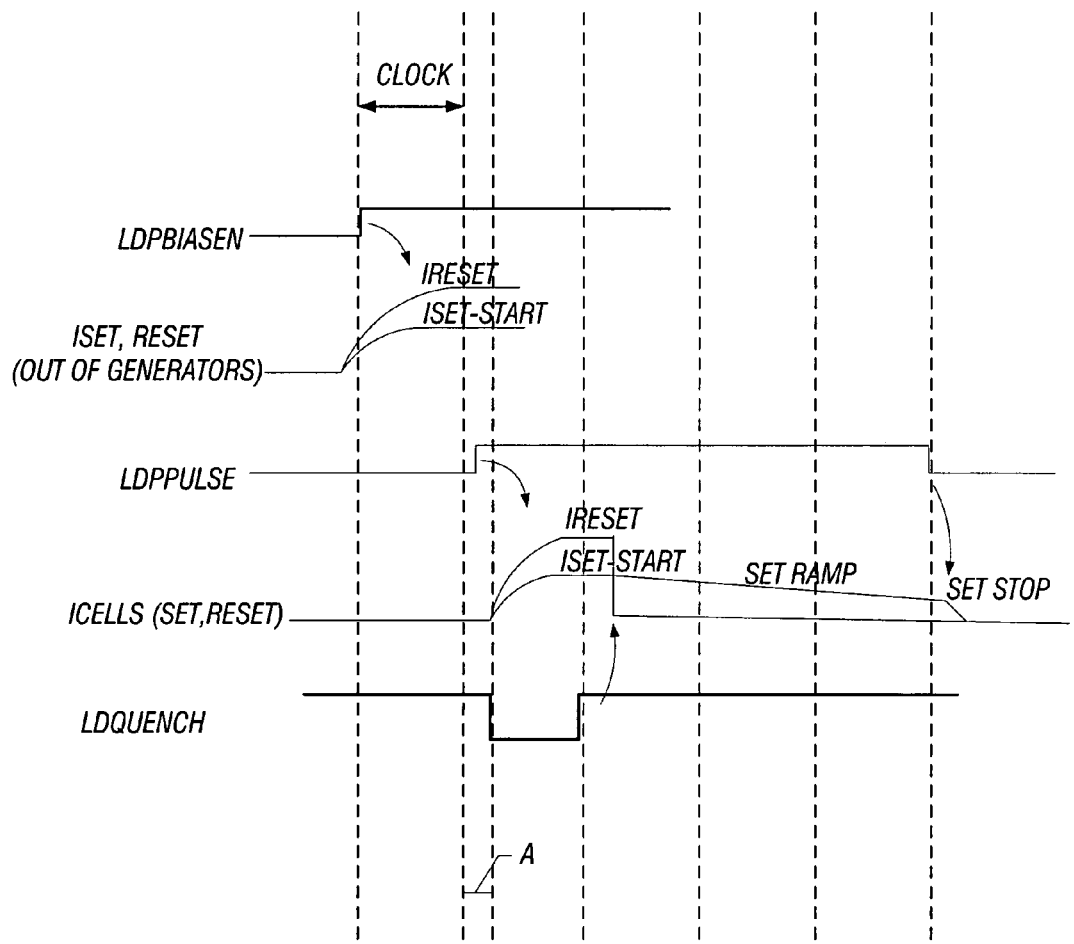
FIG. 6 is a depiction of the write signals for set and reset bits in accordance with one embodiment of the present invention.

Referring to FIG. 5, a tile is illustrated and the signals provided to and from the tile include a write control signal 90. The write control signal includes a signal LDPPULSE. That signal is shown in FIG. 6. It basically starts out at a low level and after one clock rises to a high level and then drops to a low level. LDPPULSE initiates the generation of the set and reset programming signals to the cells.

A bidirectional data bus 92 provides control signals. A line 94 provides the signal LDQUENCH across a plane. Finally, the current from the write circuits 32 (FIG. 1) is provided at 96. The logic 100 receives the bidirectional data bus signals, the LDQUENCH signals, and the write control signals. It outputs a control signal that controls a switch 106 coupled to line 96. Also, a circuit 102 outputs a control signal that controls the switch 112 also on line 96. A transistor 110 also coupled to line 96 may be selectively coupled to ground when the switch is on, in one embodiment.

Thus, the current from the write circuits 32 may be controlled by the switch 112 and the switches 104 and 106, coupled to a line 107, coupled to ground. The cells may be connected at the Y decoder level 109 as indicated.

Thus, a signal LDPBIASEN initially goes high at the beginning of a clock as shown in FIG. 6. This signal initiates the generation of the set current and the reset current from the generators 12 in FIG. 1. The generated reset current (IRESET) (FIG. 6) slowly increases to a higher level than the set current (ISET). Eventually, the signal LDPPULSE is provided on the write control line 92. As a result, the set and reset cell currents are generated at the decoder level.

The LDQUENCH signal has a delay A on its falling edge which controls the set and reset currents. The delay may be achieved by controlling the switches 112 and 106. The effect of the LDQUENCH signal is to rapidly drop the current and voltage in the reset case. It does this by simply pulling current to ground through the switches 104 and 106.

The effect of providing the delay is to enable a time period, indicated as A in FIG. 6, to pass so that any transients or spikes can be avoided. The spikes will occur initially and will be dissipated by the time the cell currents are actually generated after the time delay A.

Thus, in some embodiments, programming and quench pulses are shaped to avoid any overshoot due to parasitic capacitance. The quench may also be delayed by a period A which may amount to a few nanoseconds in some embodiments.

Programming of a chalcogenide material within a cell to alter the state or phase of the material may be accomplished by generating a voltage potential across the memory element. When the voltage potential is greater than the threshold voltages of memory element, then an electrical current may flow through the chalcogenide material in response to the applied voltage potentials, and may result in heating of the chalcogenide material.

This heating may alter the memory state or phase of the chalcogenide material. Altering the phase or state of the chalcogenide material may alter the electrical characteristic of memory material, e.g., the resistance of the material may be altered by altering the phase of the memory material. Memory material may also be referred to as a programmable resistive material.

In the "reset" state, memory material may be in an amorphous or semi-amorphous state and in the "set" state, memory material may be in a crystalline or semi-crystalline state. Both "reset" and "set" states can exist without any energy (electrical, optical, mechanical) applied to bistable chalcogenide. The resistance of memory material in the amorphous or semi-amorphous state may be greater than the resistance of memory material in the crystalline or semi-crystalline state. It is to be appreciated that the association of reset and set with amorphous and crystalline states, respectively, is a convention and that at least an opposite convention may be adopted.

Using electrical current, memory material may be heated to a relatively higher temperature to amorphosize memory material and "reset" memory material (e.g., program memory material to a logic "0" value). Heating the volume of memory material to a relatively lower crystallization temperature may crystallize memory material and "set" memory material (e.g., program memory material to a logic "1" value). Various resistances of memory material may be achieved to store information by varying the amount of current flow and duration through the volume of memory material.

Figure 7:
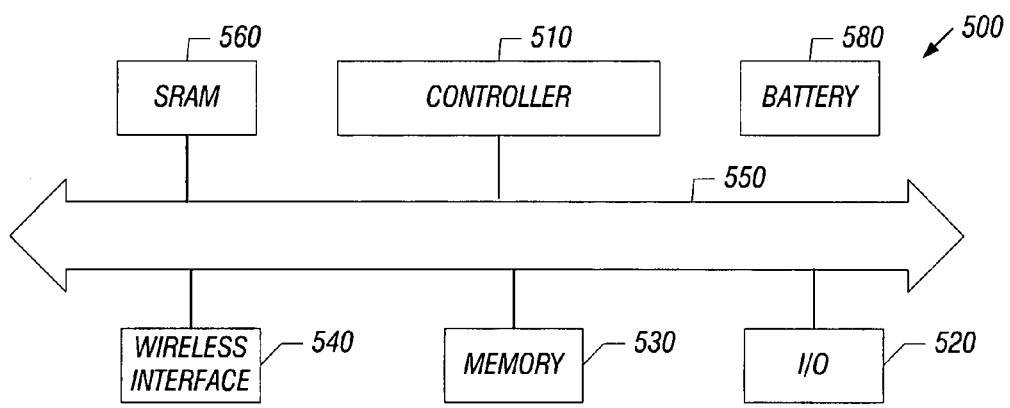
FIG. 7 is a system depiction in accordance with one embodiment of the present invention.

Turning to FIG. 7, a portion of a system 500 in accordance with an embodiment of the present invention is described. System 500 may be used in wireless or mobile devices such as, for example, a personal digital assistant (PDA), a laptop or portable computer with wireless capability, a web tablet, a wireless telephone, a pager, an instant messaging device, a digital music player, a digital camera, or other devices that may be adapted to transmit and/or receive information wirelessly. System 500 may be used in any of the following systems: a wireless local area network (WLAN) system, a wireless personal area network (WPAN) system, a cellular network, although the scope of the present invention is not limited in this respect.

System 500 may include a controller 510, an input/output (I/O) device 520 (e.g. a keypad, display), static random access memory (SRAM) 560, a memory 530, and a wireless interface 540 coupled to each other via a bus 550. A battery 580 may be used in some embodiments. It should be noted that the scope of the present invention is not limited to embodiments having any or all of these components.

Controller 510 may comprise, for example, one or more microprocessors, digital signal processors, microcontrollers, or the like. Memory 530 may be used to store messages transmitted to or by system 500. Memory 530 may also optionally be used to store instructions that are executed by controller 510 during the operation of system 500, and may be used to store user data. Memory 530 may be provided by one or more different types of memory. For example, memory 530 may comprise any type of random access memory, a volatile memory, a non-volatile memory such as a flash memory and/or a memory such as memory discussed herein.

I/O device 520 may be used by a user to generate a message. System 500 may use wireless interface 540 to transmit and receive messages to and from a wireless communication network with a radio frequency (RF) signal. Examples of wireless interface 540 may include an antenna or a wireless transceiver, although the scope of the present invention is not limited in this respect.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
generating current in a periphery outside a memory core of a bit alterable memory using an unboosted memory supply voltage of the memory; and
driving the current from the periphery into the core.

2. The method of claim 1 including using current mirrors to develop a different current for set and reset cells.

3. The method of claim 1 including mirroring said current using mirror transistors coupled to a pump voltage higher than the supply voltage.

4. The method of claim 3 including ratioing the current to generate a local reference.

5. The method of claim 4 including increasing the current by the amount by which the current was ratioed to obtain the desired current in the cells.

6. The method of claim 5 including ratioing the current at a first level corresponding to a larger portion of memory and increasing the current at a smaller portion of memory coupled to said larger portion.

7. The method of claim 6 including ratioing the current at the partition level and increasing the current at the plane level.

8. The method of claim 1 including using gate switches to supply current to cells through current mirrors coupled to the pump voltage.

9. The method of claim 1 including providing a delay before applying current to the cell to accommodate for transients.

10. A memory comprising:
a core including an array of bit alterable memory cells arranged in rows and columns;
a periphery outside said core, said periphery including a current generator to generate current for the cells in said core using an unboosted memory supply voltage; and
mirror circuits to drive current from the periphery into the core.

11. The memory of claim 10, said current mirrors to develop a different current for set and reset cells.

12. The memory of claim 10, said mirrors coupled to a pump voltage higher than the supply voltage.

13. The memory of claim 12 wherein said mirrors include a pump voltage mirror coupled to said pump voltage to ratio the current to generate a local reference.

14. The memory of claim 13, said mirrors include a pump voltage mirror to increase the ratioed current.

15. The memory of claim 14 wherein said pump voltage mirror to ratio the current at a first level of the core into a larger core portion and to increase the current at a smaller core portion coupled to said larger core portion.

16. The memory of claim 15 wherein said larger core portion is a partition that includes at least two planes, said planes including a plurality of tiles of memory and said smaller core portion is a plane.

17. The memory of claim 10 including a current mirror coupled to a pump voltage and a plurality of gate switches to supply current to cells through said current mirror coupled to a pump voltage.

18. The memory of claim 10 including a circuit to provide a delay to accommodate for transients before applying current to a cell.

19. The memory of claim 18 wherein said circuit includes logic and a plurality of switches to controllably switch current to either the cells or to ground.

20. The memory of claim 10 wherein said cells include a lone-pair semiconductor.

21. A system comprising:
a processor; and
a lone-pair semiconductor memory including a core having an array of lone-pair semiconductor cells arranged in rows and columns, a periphery outside said core, said periphery including a current generator to generate current for the cells in said core and mirror circuits to drive current from the periphery into the core using an unboosted memory supply voltage.

22. The system of claim 21 wherein said current generator to generate current in the periphery using the supply voltage of the memory.

23. The system of claim 22, said current mirrors to develop a different current for set and reset cells.

24. The system of claim 21, said mirrors coupled to a pump voltage higher than the supply voltage.

25. The system of claim 24 wherein said mirrors include a pump voltage mirror coupled to said pump voltage to ratio the current to generate a local reference.

26. The system of claim 25, said mirrors include a pump voltage mirror to increase the ratioed current.

27. The system of claim 26 wherein said pump voltage mirror to ratio the current at a first level of the core into a larger core portion and to increase the current at a smaller core portion coupled to said larger core portion.

28. The system of claim 27 wherein said larger core portion is a partition that includes at least two planes, said planes including a plurality of tiles of memory and said smaller core portion is a plane.

* * * * *